(12) United States Patent
Afghahi et al.

(10) Patent No.: US 7,271,615 B2
(45) Date of Patent: Sep. 18, 2007

(54) INTEGRATED CIRCUITS WITH REDUCED LEAKAGE CURRENT

(75) Inventors: Morteza Afghahi, Coto De Caza, CA (US); Esin Terzioglu, Aliso Viejo, CA (US); Gil I. Winograd, Aliso Viejo, CA (US)

(73) Assignee: Novelics, LLC, Aliso Viejo, CA (US)

( * ) Notice: Subject to any disclaimer, the term of this patent is extended or adjusted under 35 U.S.C. 154(b) by 84 days.

(21) Appl. No.: 11/301,236

(22) Filed: Dec. 12, 2005

(65) Prior Publication Data

US 2007/0040575 A1 Feb. 22, 2007

Related U.S. Application Data

(60) Provisional application No. 60/708,729, filed on Aug. 16, 2005.

(51) Int. Cl.
*H03K 17/16* (2006.01)
*H03K 19/003* (2006.01)

(52) U.S. Cl. ........................ 326/33; 326/34; 326/112; 326/119

(58) Field of Classification Search ................. 326/17, 326/33–34, 112, 119, 121; 327/544; 365/226–227
See application file for complete search history.

(56) References Cited

U.S. PATENT DOCUMENTS 6,977,519 B2 * 12/2005 Bhavnagarwala et al. .... 326/34
7,126,370 B2 * 10/2006 Bhattacharya ............... 326/33

* cited by examiner

*Primary Examiner*—Anh Q. Tran
(74) *Attorney, Agent, or Firm*—Jonathan W. Hallman; MacPherson Kwok Chen & Heid LLP (57) ABSTRACT

In one embodiment, NMOS transistors have their source coupled to a common source node such that the NMOS transistors conduct a leakage current if the common source node is grounded. To reduce this leakage current, the common source node is raised in potential. Similarly, PMOS transistors have their source coupled to a common source node such that the PMOS transistors conduct a leakage current if the common source node is charged to a power supply voltage VDD. To reduce this leakage current, the common source node is lowered in potential.

20 Claims, 5 Drawing Sheets

INTEGRATED CIRCUITS WITH REDUCED LEAKAGE CURRENT

This application claims benefit of 60/708,729 filed on Aug. 16, 2005.

BACKGROUND OF THE INVENTION

The present invention relates to integrated circuits, and more particularly to integrated circuits having reduced leakage current.

As circuit dimensions continue to shrink, power dissipation due to leakage current is becoming an ever greater problem. Leakage-current-induced power dissipation in mobile devices such as cell phones reduces battery life, thereby inconveniencing users by requiring more frequent re-charges. Ideally, a transistor in a digital integrated circuit acts like a switch, being either in a conductive (on) state or a non-conductive (off) state. However, transistors always conduct some amount of leakage current in the off state. As process technology advances into the 90 nanometer (nm) or 65 nm dimensions and smaller, the ability to close the channel between source and drain in a transistor weakens such that "subthreshold" leakage current continues to flow between the source and drain even when the transistor is turned solidly off.

Some approaches to mitigate subthreshold leakage current include lengthening the channel. However, that approach reduces achievable component density, thereby obviating one of the major advantages of modem process technology. Rather than lengthen the channel, other approaches use multiple gates, which increases process complexity and still reduces component density. Accordingly, there is a need in the art for integrated circuits having improved leakage current reduction.

SUMMARY

This section summarizes some features of the invention. Other features are described in the subsequent sections.

In accordance with an aspect of the invention, a method of reducing leakage current in an array of circuits is provided, each circuit having an active mode and an inactive mode, each circuit including a set of at least one NMOS transistor, each NMOS transistor in the set having its source connected to a common source node, each NMOS transistor in the set having a gate driven to a ground voltage VSS if its circuit is in the inactive mode, each NMOS transistor in the set being sized so as to conduct a first leakage current if its circuit is in the inactive mode, its source pulled to VSS, and its drain pulled to a power supply voltage VDD. The method includes the acts of: if all the circuits in the array are in the inactive mode, switching on a first transistor coupled between the common source node and a ground terminal, the first transistor being sized such that common source node thereby floats higher in potential than VSS.

In accordance with another aspect of the invention, a method of reducing leakage current in an array of circuits is provided, each circuit having an active mode and an inactive mode, each circuit including a set of at least one PMOS transistor, each PMOS transistor in the set having its source connected to a common source node, each PMOS transistor in the set having a gate driven to a power supply voltage VDD if its circuit is in the inactive mode, each PMOS transistor in the set being sized so as to conduct a first leakage current if its circuit is in the inactive mode, its source pulled to a power supply potential VSS, and its drain pulled to a ground potential. The method includes the acts of: if all the circuits in the array are in the inactive mode, switching on a first transistor coupled between the common source node and a power supply terminal, the first transistor being sized such that common source node thereby floats lower in potential than VDD In accordance with another aspect of the invention, a leakage reduction circuit is provided that is adapted to reduce leakage for a plurality of NMOS transistors, each NMOS transistor having its source connected to a common source node, each NMOS transistor having a gate driven to a ground voltage VSS if the circuit is in an inactive mode, each NMOS transistor conducting a first leakage current if its circuit is in the inactive mode, its source pulled to VSS, and its drain pulled to a power supply voltage VDD, the circuit comprising: a first transistor coupled between the common source node and a local ground, the first transistor being adapted to be conductive if the circuit is in the inactive mode, the first transistor being sized such that the common source node thereby floats higher in potential than VSS if the circuit is in the inactive mode to drive the NMOS transistors to conduct a second leakage current that is less than the first leakage current if the circuit.

In accordance with another aspect of the invention, a leakage reduction circuit is provided that is adapted to reduce leakage for a plurality of PMOS transistors, each PMOS transistor having its source connected to a common source node, each PMOS transistor having a gate driven to a power supply voltage VDD if the circuit is in an inactive mode, each PMOS transistor in the set being sized so as to conduct a first leakage current if its circuit is in the inactive mode, its source pulled to a power supply potential VDD, and its drain pulled to a ground potential, the circuit comprising: a first transistor coupled between the common source node and a power supply terminal, the first transistor being adapted to be conductive if the circuit is in the inactive mode, the first conductor being sized such that the common source node thereby floats lower in potential than VDD if the circuit is in the inactive mode to drive the PMOS transistors to conduct a second leakage current that is less than the first leakage current.

The invention is not limited to the features and advantages described above. Other features are described below. The invention is defined by the appended claims.

DETAILED DESCRIPTION

Reference will now be made in detail to one or more embodiments of the invention. While the invention will be described with respect to these embodiments, it should be understood that the invention is not limited to any particular embodiment. On the contrary, the invention includes alternatives, modifications, and equivalents as may come within the spirit and scope of the appended claims. Furthermore, in the following description, numerous specific details are set forth to provide a thorough understanding of the invention. The invention may be practiced without some or all of these specific details. In other instances, well-known structures and principles of operation have not been described in detail to avoid obscuring the invention.

Conventional integrated circuits typically include circuit arrays in which only a few (typically just one) circuit is active at any given time. For example, memories require address decoders such as row-decoders or wordline-decoders wherein only a single decoder is active depending upon the decoded address. Generally, such circuits include a set of NMOS transistors sharing a common source node tied to a local ground (VSS) and sharing a common drain node tied to VDD. The gate voltages (Vg) of the NMOS transistors in the sets are driven to VSS if the corresponding circuit in which they are incorporated is inactive. If a circuit is active, however, Vg may either be held to VDD or switched periodically to VDD. Similarly, such circuits also include a set of PMOS transistors sharing a common source node tied to VDD and sharing a common drain node tied to VSS. The gate voltages (Vg) of the PMOS transistors in a set in an inactive circuit are driven to VDD. If a circuit is active, however, Vg may either be held to VSS or switched periodically to VSS.

Given such a circuit array architecture, the potential for large amounts of leakage current is apparent. If the circuits are all inactive, their sets of NMOS and PMOS transistors are turned off but have drain-to-source voltages (Vds) equaling VDD. Thus, subthreshold leakage current will flow through these sets of transistors. To stem this flow of leakage current, one or both sets of the NMOS and PMOS transistors may be modified to significantly reduce subthreshold and other types of leakage current as will be explained further herein. For example, turning now to FIG. 1, consider the array of circuits 100 that include sets of NMOS transistors 105 operated as described above. For example, circuits 100 may be row-decoders, wordline-decoders, or any other type of circuit arranged in an array such that one circuit (or a subset of circuits) is active at any given time. The sources of NMOS transistors 105 are tied to a virtual ground 110 that couples to a local ground through NMOS transistors M1 and M2.

Figure 1:
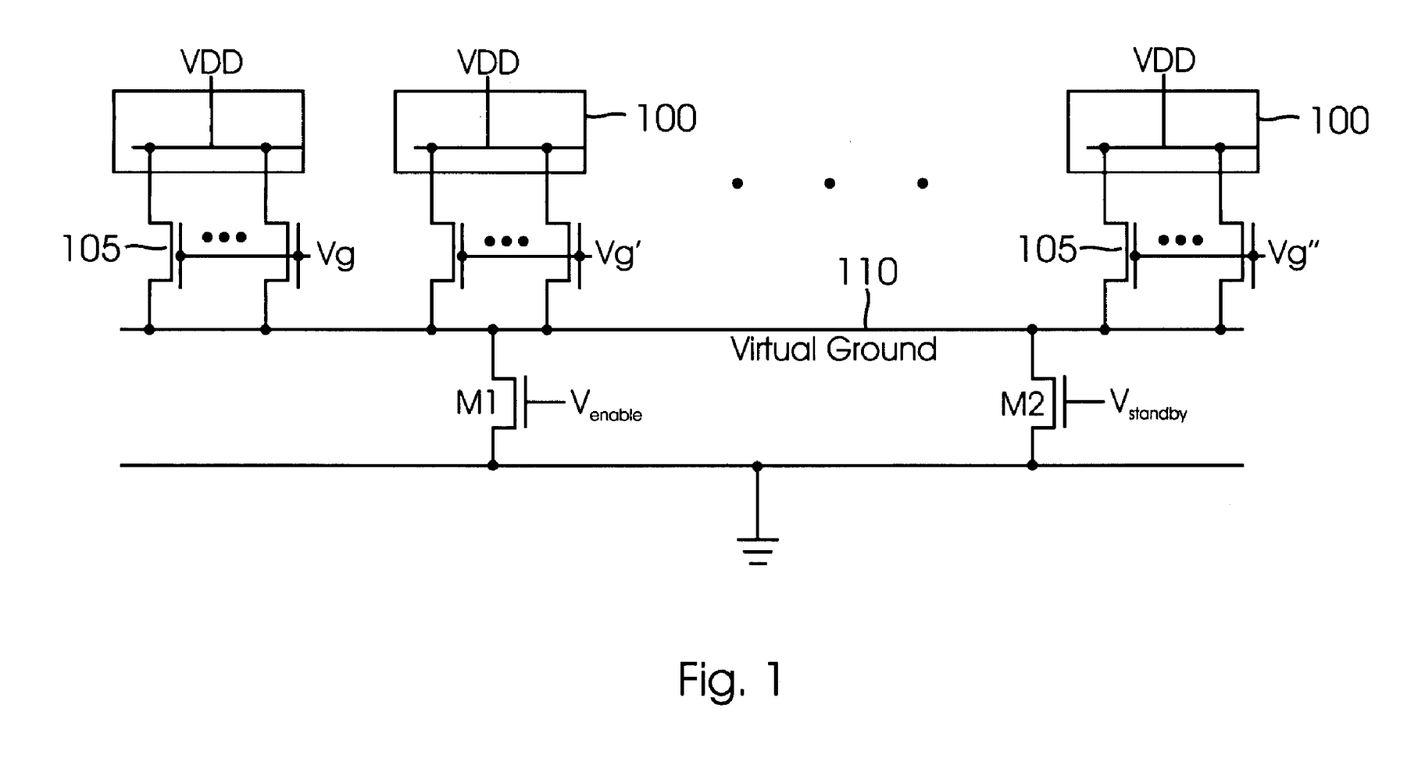
FIG. 1 is a circuit diagram of an array of NMOS transistors with their sources coupled to a virtual ground node controlled for leakage current reduction in accordance with an embodiment of the invention.

NMOS transistors M1 and M2 are controlled by mode signals $V_{enable}$ and $V_{standby}$, respectively. These mode signals may be asserted appropriately such that a normal mode, a standby mode, and a deep sleep mode of operation are enabled. The normal mode of operation corresponds to normal operation of circuits 100 (i.e, when one or more is active). In the normal mode, $V_{enable}$ is asserted so that M1 is conducting. M1 is sized so that it will easily supply the necessary current during normal operation. For example, M1 may be three times larger than transistors 105. However, should all circuits 100 be inactive and M1 still be conducting, the leakage current losses may be substantial. To prevent such losses, $V_{enable}$ may be de-asserted when circuits 100 are inactive. However, to keep virtual ground 110 from floating too high (such that undesired delay would occur before M1 could drain the excess charge on virtual ground 110 so that normal mode operation could resume), $V_{standby}$ may be asserted in a standby mode of operation if all circuits 100 are inactive. M2 functions as a "chokepoint" to the leakage current flowing through transistors 105 during standby operation. In this fashion, M2 should be sized so as to be relatively weak. For example, in one embodiment, if transistors 105 have a width to length ratio (W/L) of 10/0.13 µm, M2 may have a W/L ratio of 0.3/2 µm. Leakage current from transistors 105 will cause a voltage rise at virtual ground 110 during the standby mode because the leakage current flow is being stymied through M2. It will be appreciated that if delay is not a concern, a more efficient design would exclude M2 and rely on M1 alone to reduce leakage current.

The voltage rise at virtual ground 110 will increase the current flowing through M2 in the standby mode. In a transistor such as M2 that is switched on, the increase in current will be linearly proportional to the increasing voltage at virtual ground 110. However, the gate-to-source voltage (Vgs) for transistors 105 becomes negative as the voltage at virtual ground 110 increases because the gate voltage Vg for transistors 105 is tied to the local ground, not virtual ground 110. Moreover, leakage is further reduced because the threshold voltage Vt for transistors 105 is increased due to the body effect from the rise in potential at virtual ground 110. It may be shown that the subthreshold leakage current through NMOS transistors decreases exponentially for a negative Vgs. Thus, the leakage current through transistors 105 will have an exponential decrease in magnitude during the standby mode. The smaller the on-current for M2, the greater will be the rise in voltage at virtual ground 110 and thus the greater the increase in leakage current reduction. However, the greater the rise in voltage at virtual ground 110, the greater will be the time required to drain the excess charge from virtual ground 110 if normal mode operation is desired. Circuits 100 typically cannot function properly if virtual ground 110 is not virtually grounded during normal operation. Therefore, a tradeoff between leakage current reduction and time to recover for normal mode operation governs the choice of a size (and hence on-current magnitude) for M2.

The deep sleep mode occurs if both $V_{enable}$ and $V_{standby}$ are de-asserted such that the virtual ground floats. In this fashion, the leakage current reduction is maximized. However, the delay necessary to drain excess charge from virtual ground 110 before normal operation may be resumed from a deep sleep mode is greater as compared to a transition from standby mode.

It may be observed that the leakage current reduction benefits provided by transistors M1 and M2 will be diminished if increasing numbers of circuits 100 are active in the normal mode of operation. For example, suppose all circuits 100 are active in the normal mode. Transistor M1 must then be quite massive to supply the necessary current to the switching transistors. To provide an equivalent leakage current reduction using the die area space that would have to be devoted to M1, transistors 105 could simply have their W/L ratio adjusted to reduce their leakage current. M2 need not be so massive, however, if only one or a few circuits are active at any given time in the normal mode of operation.

Figure 2:
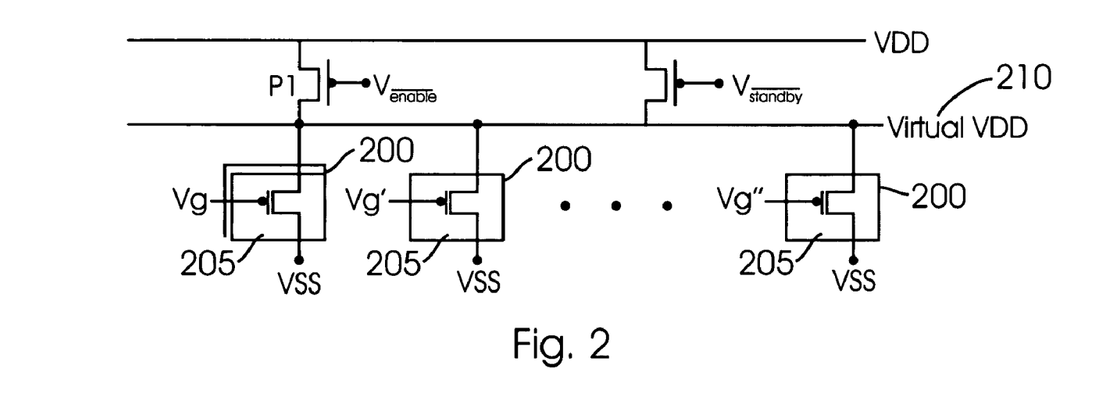
FIG. 2 is a circuit diagram of an array of PMOS transistors with their sources coupled to a virtual VDD node controlled for leakage current reduction in accordance with an embodiment of the invention.

The leakage current reduction explained with regard to NMOS transistors 105 may be extended to sets of PMOS transistors 205 as shown in FIG. 2. An array of circuits 200 act as described with regard to circuits 100 of FIG. 1 in that just a subset (such as just one) of circuits 200 is active at any given time in a normal mode of operation. Each circuit 200 includes one or more PMOS transistors 205 that have a common source node connected to a virtual VDD node 210. If a circuit 200 is active, the gate voltage Vg for its corresponding PMOS transistors 205 is either held low or is periodically switched low. However, if a circuit 200 is not active, its gate voltage is pulled to VDD. Virtual VDD 210 couples to actual VDD through PMOS transistors P1 and P2. P1 is the analog of M1 (FIG. 1) in that it is sized sufficiently to conduct the necessary current to PMOS transistors 205 in an active circuit 200. Because P1 is a PMOS transistor, its gate voltage $\overline{VENABLE}$ is the complement of the voltage $V_{enable}$ used to drive NMOS transistors 105 (should circuits 200 include such transistors, for illustration clarity they are not illustrated). In a standby mode of operation in which all circuits 200 are inactive, $\overline{VENABLE}$ is brought high. However, a gate voltage $\overline{VSTANDBY}$ for a P2 transistor is brought low in the inactive mode, where $\overline{VSTANDBY}$ is the complement of the voltage $V_{standby}$ used to drive NMOS transistors 105 (if included in circuits 200). P2 is a relatively weak transistor sized analogously as discussed with regard to N2 to provide a chokepoint for the leakage current that would otherwise flow through transistors 205. Because of the current flow through P2, virtual VDD will be slightly lower in potential than VDD in the inactive mode of operation. Because the gate voltage Vg applied to PMOS transistors 205 is true VDD (rather than virtual VDD), the gate-to-source voltage (Vgs) for PMOS transistors 205 is positive. A positive Vgs voltage for PMOS transistors 205 has the same effect of exponential leakage current reduction as does a negative Vgs voltage for NMOS transistors 105. In this fashion, the overall leakage current through PMOS transistors 205 in the standby mode is substantially reduced. Further reduction of the leakage current is available if both P1 and P2 are non-conducting in a deep sleep mode of operation analogously as discussed with regard to FIG. 1.

Figure 3:
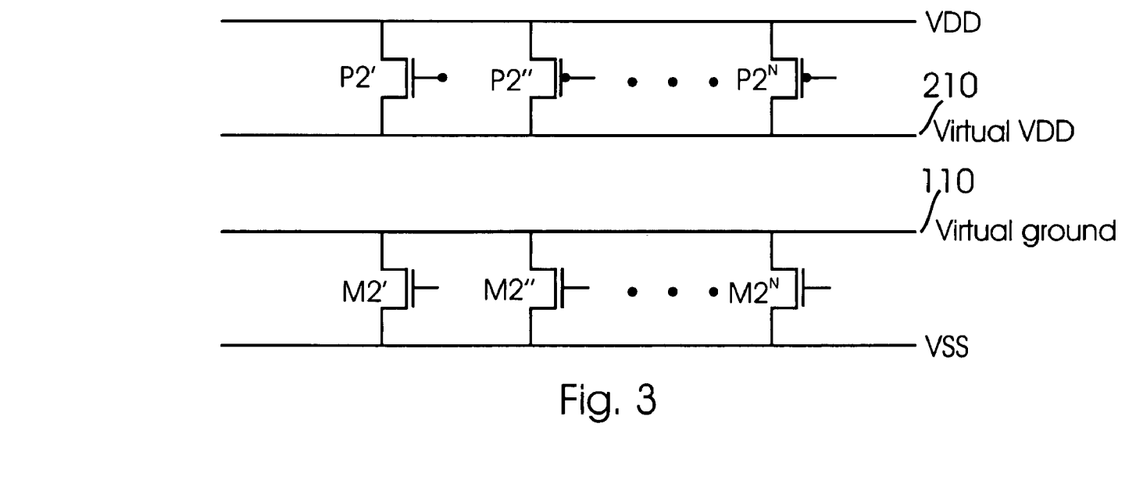
FIG. 3 is a circuit diagram of a virtual VDD node and a virtual ground node configurably controlled for leakage current reduction in accordance with an embodiment of the invention.

The tradeoff governing the desired size for transistors N2 and P2 may be affected by unpredictable or uncertain parameters. For example, leakage current may be affected by semiconductor process variability (fast or slow process corners), temperature, and other variables that cannot be predicted a priori. In turn, this unpredictability may complicate the design choice of how large transistors M2 and P2 should be to effect a desired tradeoff between leakage current reduction and recovery time necessary to begin a normal mode of operation. To ease this design choice, a series of selectable transistors N2' through N2$^N$ may be used in place of N2 and/or transistors P2' through P2$^N$ may be used in place of P2 as seen in FIG. 3. The standby control signals would then be coded such that a suitable subset of these transistors conducts in the standby mode. A controller (not illustrated) would determine the appropriate subset by selectively activating the transistors and determining whether the potential on virtual VDD 210 and virtual VSS 110 in the standby mode is appropriate in regard to a desired tradeoff between leakage current reduction and recovery time.

Figure 4:
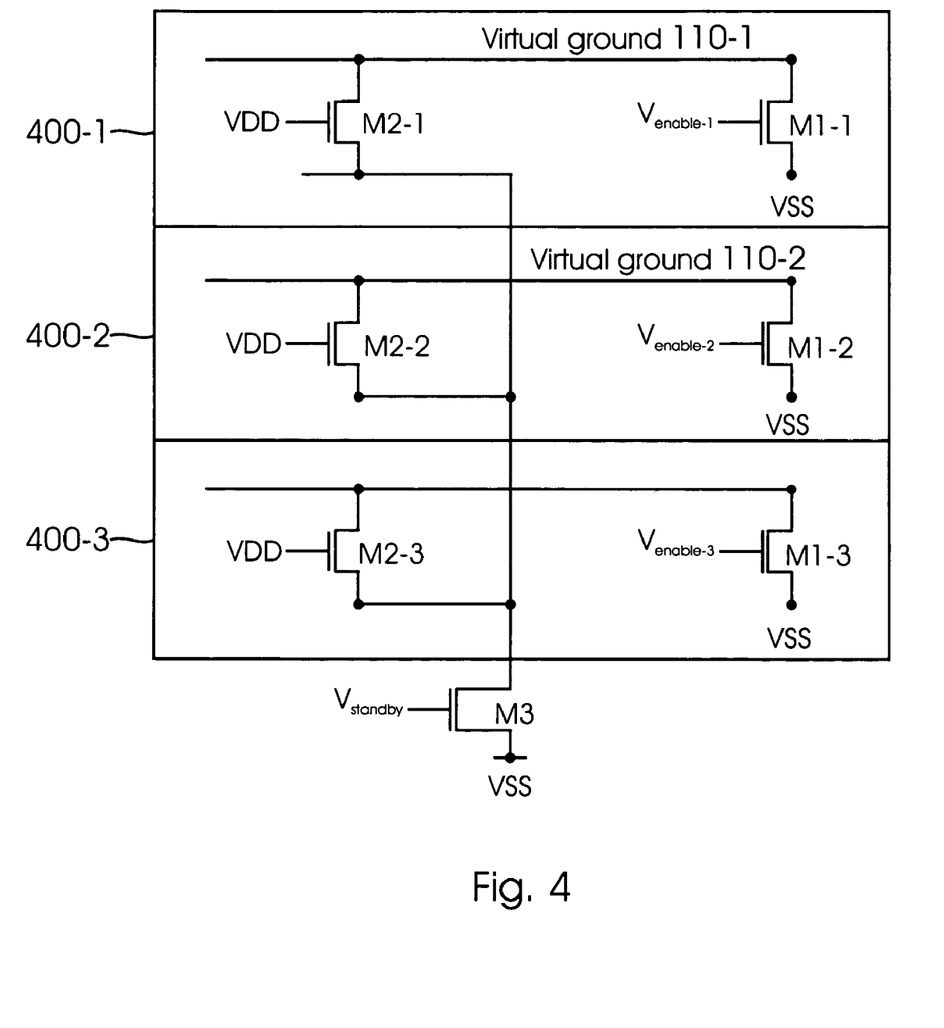
FIG. 4 is a circuit diagram of an array of sub-arrays, wherein each sub-array has a virtual ground controlled for leakage current reduction in accordance with an embodiment of the invention.

Further leakage current reduction may be obtained by organizing the array of circuits having its leakage current into groups of sub-arrays. For example, suppose circuits 100 comprise an array of 128 X-decoders. If a given X-decoder is active and the array is organized as discussed with regard to FIGS. 1 and 2, all the remaining X-decoders may leak despite not being used. However, if the X-decoders are arranged into sub-arrays, for example four sub-arrays of 32 X-decoders each, a given sub-array may be in the normal mode of operation while the remaining groups are in the standby or deep sleep mode, thereby reducing leakage current in the normal mode of operation. Moreover, each sub-array may have its own virtual ground and virtual VDD nodes as well. For example, turning now to FIG. 4, three sub-arrays 400-1 through 400-3 each have a virtual ground (elements 110-1 through 110-3, respectively), that couples to the sources of NMOS transistors (not illustrated) that require leakage current reduction. Each virtual ground 110-1 through 110-3 may be pulled low in a normal mode of operation by a corresponding NMOS transistor M1-1 through M3-1, respectively. Similarly, each virtual ground 110-1 through 110-3 couples through an NMOS transistor M2-1 through M2-3, respectively, to an NMOS transistor M3 controlled by the voltage $V_{standby}$. M3 thus functions as the analog of M2 in FIG. 1. Transistors M2-1 through M2-3 may either be tied to VDD as shown or tied to the inverse of the corresponding $V_{enable}$ signal.

Figure 5:
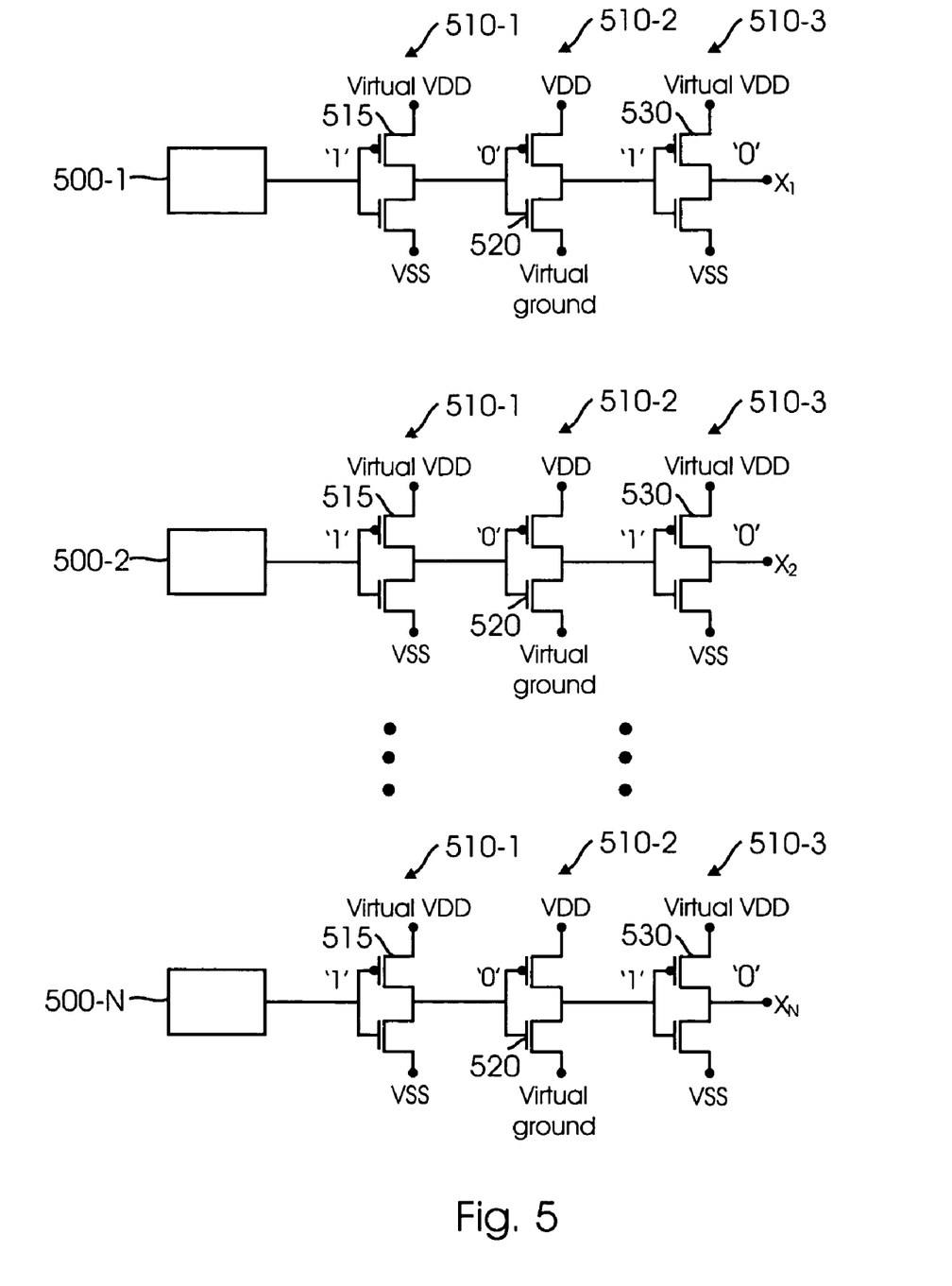
FIG. 5 is a circuit diagram of an array of X-decoders whose output stages are selectively coupled to a virtual VDD node and a virtual ground node for leakage current reduction in accordance with an embodiment of the invention.

In general, the larger the width a transistor 105 has as compared to a given length, the greater its leakage current will be. Thus, there may be a subset of NMOS transistors 105 that provide the great majority of the total leakage current. In that regard, the leakage reduction circuits and techniques disclosed herein may be applied to just such a subset of transistors and achieve substantially the same overall leakage current reduction. For example, turning now to FIG. 5, should circuits 100 comprise X-decoders 500, it is conventional for each X-decoder 500 to have relatively large (with regard to other transistors) transistors in its output stage comprised of CMOS inverters 510. For example, a first X-decoder 500-1 drives its output stages 510 to bring a corresponding word line X1 either high or low. Similarly, an nth X-decoder 500-n drives its output stages 510 to bring a word line XN either high or low. The states of CMOS inverters 510 are known if all word lines are inactive. Each stage 510 will have either a PMOS transistor or an NMOS transistor that is turned off but conducting leakage current. For example, a first stage 510-1 has its input driven high (corresponding to a logical '1') by its corresponding X-decoder. Thus, a PMOS transistor 515 in each first stage 510-1 may be conducting leakage current if its X-decoder is inactive. To prevent this leakage current, each PMOS transistor 515 has its source tied to a virtual VDD controlled, for example, as discussed with regard to FIG. 2. Similarly, each second stage 510-2 has its input driven low (corresponding to a logical '0') by the corresponding first stage. Thus, an NMOS transistor 520 may be conducting leakage current if its X-decoder is inactive. To prevent this leakage current, each NMOS transistor 520 has its source tied to a virtual ground controlled, for example, as discussed with regard to FIG. 2. Finally, each third stage 510-3 has its PMOS transistor 530 controlled as discussed for stage 510-1.

The leakage current reduction techniques described herein may be applied to two-dimensional arrays of memory circuits such as, for example, SRAM cells. In such arrays, it is conventional that only a single row is active at any given time. Thus, each column in such an array has the property that only a single memory cell will be active at any given time. Accordingly, each column in such an array may have its leakage current reduced in accordance with the techniques disclosed herein. For example, in an SRAM cell, if the virtual VDD and virtual ground nodes are not allowed to float too far from VDD and VSS, respectively, then the memory contents of the SRAM cell will be preserved in the standby mode. However, the memory contents will eventually be lost in the deep sleep mode.

Figure 6:
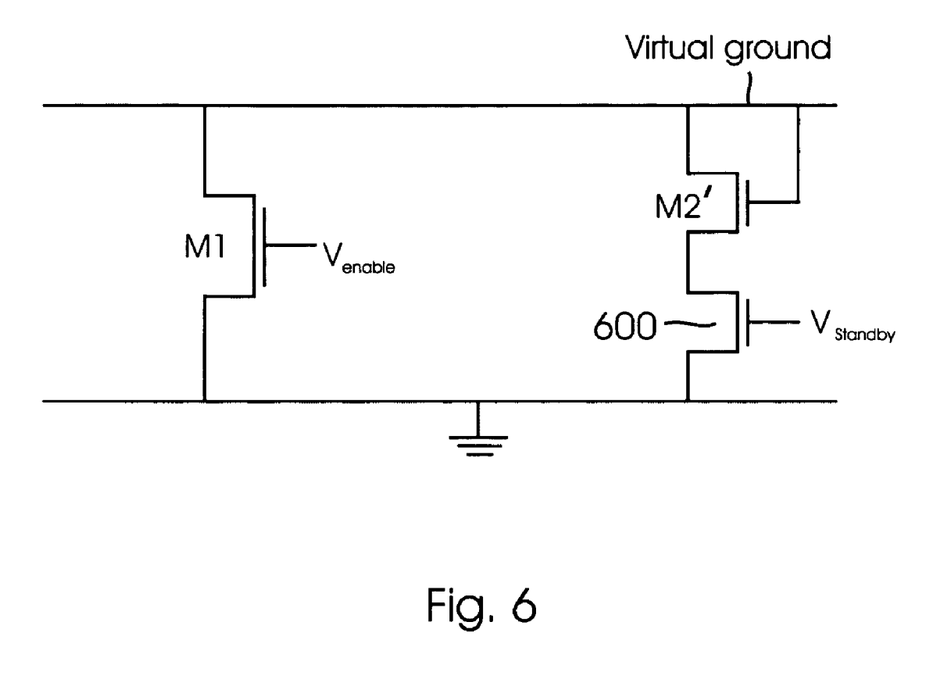
FIG. 6 illustrates a leakage reduction circuit in which transistor M2 is implemented using a diode-connected native NMOS transistor in accordance with an embodiment of the invention.

As discussed with regard to FIG. 3, process variations and other effects may make it difficult to predict in advance the particular size transistor best suited to serve as M2 or P2. For example, with regard to M2, it is desired to be weak such that it chokes the leakage current but yet not so weak that the virtual ground would raise too high in potential. Regardless of its size, transistor M2 cannot conduct until its threshold voltage Vt is exceeded. Once a non-native transistor such as M2 is conducting, the relationship between the current it conducts and Vds is substantially linear. In general, the Vt for a non-native transistor is approximately 0.3 V, which means the virtual ground must float up to this value before M2 conducts. However, should a process variation be such that the total leakage current being conducted through M2 is twice what is expected, the virtual ground could float to approximately 0.6 V given the linear relationship between current and voltage. Turning now to FIG. 6, it may be seen that forming transistor M2 using a diode-connected native transistors M2' eases the design choice. A native transistor has its channel blocked or masked during the implant step that adjusts the threshold voltage for non-native transistors. In contrast to transistors with channel implants, an NMOS native transistor has a threshold voltage equaling approximately 0 volts. Moreover, the current is proportional to the square of the Vgs voltage in a native NMOS transistor. Thus, even if process variations cause an unexpectedly high leakage currents to flow through M2', the voltage change at the virtual ground will be less dramatic as compared to a non-native transistor embodiment. Because M2' is diode connected, it must be switched through a serial connection to a transistor 600 whose gate voltage is controlled by the $V_{standby}$ as discussed with respect to FIG. 2. Thus, when $V_{standby}$ is asserted, the standby mode of operation is enabled. It will be appreciated that an analogous diode-connected native PMOS transistor could be used in place of the P2 transistor discussed with regard to FIG. 3.

The above-described embodiments of the present invention are merely meant to be illustrative and not limiting. It will thus be obvious to those skilled in the art that various changes and modifications may be made without departing from this invention in its broader aspects. Therefore, the appended claims encompass all such changes and modifications as fall within the true spirit and scope of this invention.

We claim:

1. A method of reducing leakage current in an array of circuits, each circuit having an active mode and an inactive mode, each circuit including a set of at least one NMOS transistor, each NMOS transistor in the set having its source connected to a common source node, each NMOS transistor in the set having a gate driven to a ground voltage VSS if its circuit is in the inactive mode, each NMOS transistor in the set being sized so as to conduct a first leakage current if its circuit is in the inactive mode, its source pulled to VSS, and its drain pulled to a power supply voltage VDD, the method comprising:

if all the circuits in the array are in the inactive mode, switching on a first transistor coupled between the common source node and a ground terminal, the first transistor being sized such that the common source node thereby floats higher in potential than VSS to thereby drive the NMOS transistors to conduct a second leakage current that is less than the first leakage current.

2. The method of claim 1, further comprising:
if one or more of the circuits are to placed into the active mode, switching on a second transistor coupled between the common source node and the ground terminal, the second transistor being sized such that the common source node is thereby pulled to VSS.

3. The method of claim 2, further comprising:
switching off both the first and the second transistors, whereby the common source node floats in potential towards VDD.

4. A method of reducing leakage current in an array of circuits, each circuit having an active mode and an inactive mode, each circuit including a set of at least one PMOS transistor, each PMOS transistor in the set having its source connected to a common source node, each PMOS transistor in the set having a gate driven to a power supply voltage VDD if its circuit is in the inactive mode, each PMOS transistor in the set being sized so as to conduct a first leakage current if its circuit is in the inactive mode, its source pulled to the power supply voltage VDD, and its drain pulled to ground, the method comprising:

if all the circuits in the array are in the inactive mode, switching on a first transistor coupled between the common source node and a power supply terminal, the first transistor being sized such that the common source node thereby floats lower in potential than VDD to thereby drive the PMOS transistors to conduct a second leakage current that is less than the first leakage current.

5. The method of claim 4, further comprising:
if one or more of the circuits are to placed into the active mode, switching on a second transistor coupled between the common source node and the power supply terminal, the second transistor being sized such that the common source node is thereby pulled to VDD.

6. The method of claim 5, further comprising:
switching off both the first and the second transistors, whereby the common source node floats in potential towards VSS.

7. A leakage reduction circuit adapted to reduce leakage for a plurality of NMOS transistors, each NMOS transistor having its source connected to a common source node, each NMOS transistor having a gate driven to a ground voltage VSS if the circuit is in an inactive mode, each NMOS transistor conducting a first leakage current if its circuit is in the inactive mode, its source pulled to VSS, and its drain pulled to a power supply voltage VDD, the circuit comprising:

a first transistor coupled between the common source node and a local ground, the first transistor being adapted to be conductive if the circuit is in the inactive mode, the first transistor being sized such that the common source node thereby floats higher in potential than VSS if the circuit is in the inactive mode to drive the NMOS transistors to conduct a second leakage current that is less than the first leakage current.

8. The leakage reduction circuit of claim 7, further comprising:
a second transistor coupled between the common source node and the local ground, the second transistor being adapted to be conductive if the circuit is in an active mode, the second transistor having a larger channel than the first transistor.

9. The leakage reduction circuit of claim 8, wherein both the first and second transistors are NMOS transistors.

10. The leakage reduction circuit of claim 8, wherein the first NMOS transistor is a diode-connected native NMOS transistor.

11. The leakage reduction circuit of claim 8, wherein the plurality of NMOS transistors are within a plurality of address decoders.

12. The leakage reduction circuit of claim 8, wherein the plurality of NMOS transistors are within a plurality of memory cells.

13. The leakage reduction circuit of claim 12, wherein the plurality of memory cells are SRAM cells.

14. A leakage reduction circuit adapted to reduce leakage for a plurality of PMOS transistors, each PMOS transistor having its source connected to a common source node, each PMOS transistor having a gate driven to a power supply voltage VDD if the circuit is in an inactive mode, each PMOS transistor in the set being sized so as to conduct a first leakage current if its circuit is in the inactive mode, its source pulled to power supply voltage VDD, and its drain pulled to ground, the circuit comprising:
   a first transistor coupled between the common source node and a power supply terminal, the first transistor being adapted to be conductive if the circuit is in the inactive mode, the first conductor being sized such that the common source node thereby floats lower in potential than VDD if the circuit is in the inactive mode to drive the PMOS transistors to conduct a second leakage current that is less than the first leakage current.

15. The leakage reduction of claim 14, further comprising:
   a second transistor coupled between the common source node and the power supply terminal, the second transistor being adapted to be conductive if the circuit is in the active mode, the second transistor being sized such that the common source node is thereby pulled to VDD if the circuit is in the active mode.

16. The leakage reduction circuit of claim 15, wherein both the first and second transistors are PMOS transistors.

17. The leakage reduction circuit of claim 16, wherein the first PMOS transistor is a diode-connected native PMOS transistor.

18. The leakage reduction circuit of claim 15, wherein the plurality of PMOS transistors are within a plurality of address decoders.

19. The leakage reduction circuit of claim 15, wherein the plurality of PMOS transistors are within a plurality of memory cells.

20. The leakage reduction circuit of claim 15, wherein the plurality of memory cells are SRAM cells.

* * * * *